(12) United States Patent
Nagayama et al.

(10) Patent No.: US 7,224,117 B2
(45) Date of Patent: May 29, 2007

(54) LIGHT EMITTING DISPLAY PANEL AND METHOD OF FABRICATING THE SAME

(75) Inventors: Kenichi Nagayama, Tsurugashima (JP); Masahiro Shiratori, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 224 days.

(21) Appl. No.: 10/816,838

(22) Filed: Apr. 5, 2004

(65) Prior Publication Data

US 2004/0256982 A1    Dec. 23, 2004

(30) Foreign Application Priority Data

Apr. 8, 2003    (JP)    ............................ 2003-103802

(51) Int. Cl.
*H05B 33/00*    (2006.01)
(52) U.S. Cl. ...................... 313/506; 313/505; 313/332

(58) Field of Classification Search ........ 313/498–512, 313/331, 332
See application file for complete search history.

(56) References Cited

U.S. PATENT DOCUMENTS

| | | | | |
|---|---|---|---|---|
| 5,266,865 A | * | 11/1993 | Haizumi et al. | ............. 313/506 |
| 5,469,019 A | * | 11/1995 | Mori | ........................... 313/509 |
| 6,107,735 A | * | 8/2000 | Hora | ........................... 313/506 |

FOREIGN PATENT DOCUMENTS

JP    2000-243558 A    9/2000

* cited by examiner

*Primary Examiner*—Ashok Patel
(74) *Attorney, Agent, or Firm*—Sughrue Mion, PLLC

(57) ABSTRACT

A light emitting display panel which is provided with a sandwiched portion that is sandwiched between a connection end portion of an electrode and an electrode extension. The sandwiched portion is formed of at least one layer of a light emission functioning layer stack.

8 Claims, 10 Drawing Sheets

IMMEDIATELY AFTER DEPOSITION

AFTER HEATING

LIGHT EMITTING DISPLAY PANEL AND METHOD OF FABRICATING THE SAME

BACKGROUND OF THE INVENTION

1. Field of the Invention

The present invention relates to a light emitting display panel and method of fabricating the same.

2. Description of the Related Art

Conventionally, a light emitting display panel is known which includes light emitting elements disposed in a matrix. FIG. 1 shows a conventional organic electroluminescence (EL) light emitting display panel 1 that employs organic EL elements as the light emitting elements. In the organic EL light emitting display panel 1, an array of stripe-formed anode electrodes 3 and a light emission functioning layer stack 4 are stacked in this order, and an array of stripe-formed cathode electrodes 5 is disposed on the light emission functioning layer stack 4 in orthogonal relation to the anode electrodes 3 (e.g., see Japanese Patent Application Kokai No. 2000-243558).

The cathode electrodes 5 made of Al or Mg are connected to cathode extensions 6 made of a material (such as Mo, Ni, or W, or an alloy thereof) which is different from that of the cathode material. There is disposed an insulating film 7, which is made of an insulating material, between an end portion of the cathode extension 6 and the cathode electrode 5. The insulating film 7 covers the end portion of the cathode extension 6 to provide a slanted face, which is less in steepness than the end face of the end portion with respect to the principal surface of a substrate 2.

The cathode electrode 5 is connected to the cathode extension 6 at a connection area 8 in which the cathode extension 6 is not covered by the insulating film 7. The anode electrode 3 and the cathode extension 6 are connected to an external drive circuit (not shown).

With the organic EL light emitting display constructed in this manner, a desired voltage is applied to a predetermined cathode and anode electrode, thereby allowing a light emission functioning layer at the pixel region sandwiched between the two electrodes to emit light.

SUMMARY OF THE INVENTION

A method of fabricating the aforementioned light emitting display panel requires the steps of preparing an insulating film material and providing an insulating film at the end portion of the cathode extension, thereby making the fabrication process complicated.

It is therefore an object of the present invention to solve the aforementioned problem.

According to the present invention, there is provided a light emitting display panel including at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected, the light emitting panel comprises a sandwiched portion sandwiched between the electrode extension and the connection end portion, wherein the sandwiched portion includes at least one layer of the light emission functioning layer stack.

According to the present invention, there is provided a method of fabricating a light emitting display panel including at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected, the method comprises forming the electrode extension, forming a sandwiched portion including at least one layer of the light emission functioning layer stack at the electrode extension, and connecting the connection end portion to the electrode extension.

According to the present invention, there is provided a method of fabricating a light emitting display panel including at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected, the method comprises forming the first electrode, forming a sandwiched portion including at least one layer of the light emission functioning layer stack at the first electrode, and connecting the electrode extension to the connection end portion.

DETAILED DESCRIPTION OF THE INVENTION

Figure 1:
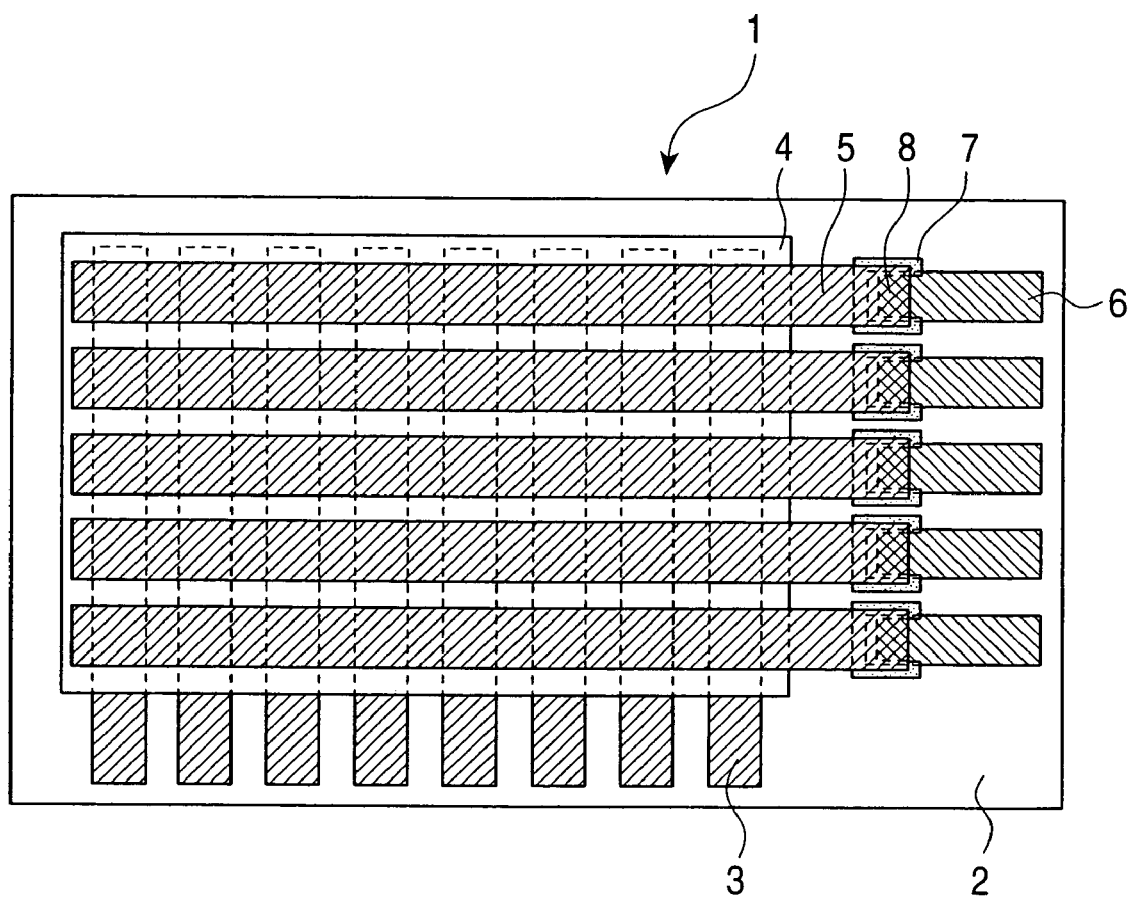
FIG. 1 is a schematic plan view illustrating the structure of a conventional light emitting display panel.

The present invention will be now described below in more detail with reference to the accompanying drawings in accordance with the embodiments. For simplicity, the light emitting display panels in the drawings are illustrated with a less number of electrodes than they actually have.

Figure 2:
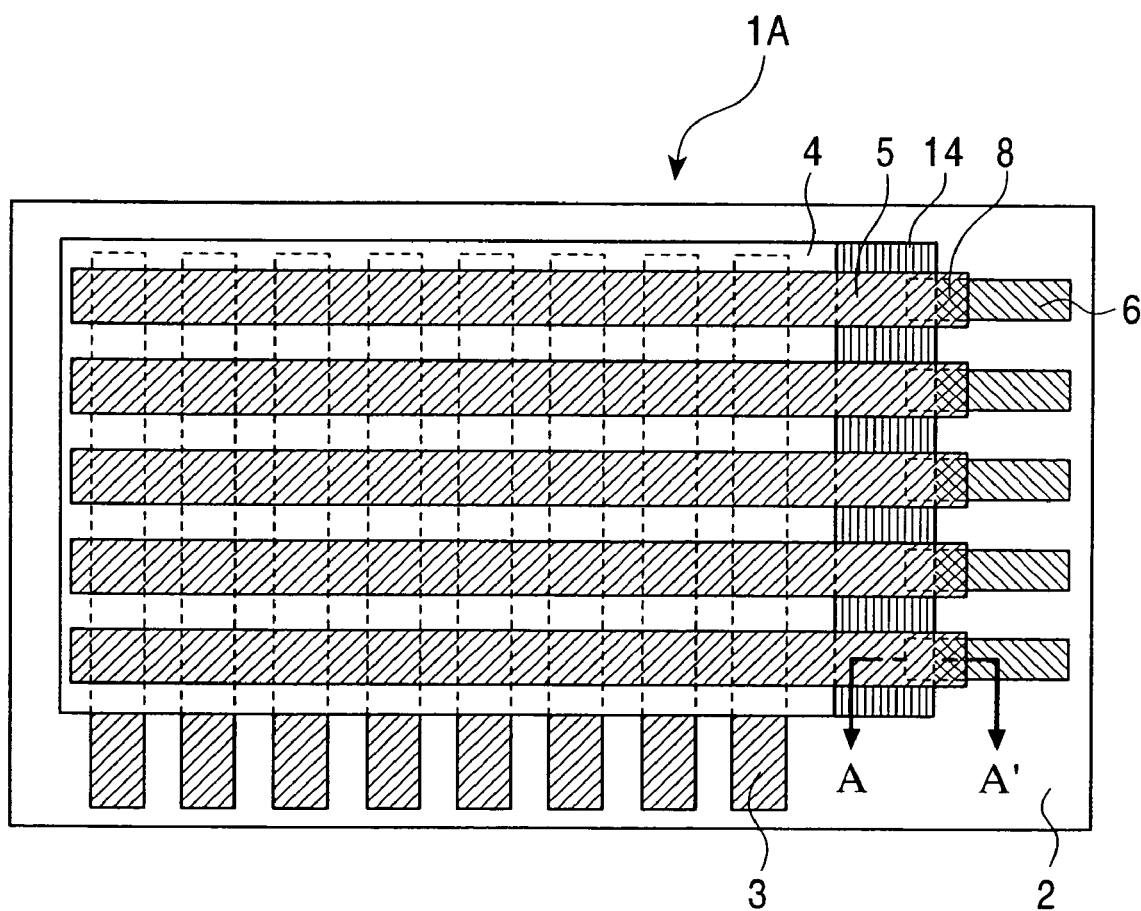
FIG. 2 is a schematic plan view illustrating the structure of a light emitting display panel according to the present invention.

As shown in FIG. 2, an organic EL light emitting display panel 1A according to the present invention has a plurality of (i.e., an array of) stripe anode electrodes 3 disposed in a stripe arrangement on the substrate 2, with the light emission functioning layer stack 4 provided on the anode electrode 3. The light emission functioning layer stack 4 includes a light emitting layer that emits light when powered.

Figure 3:
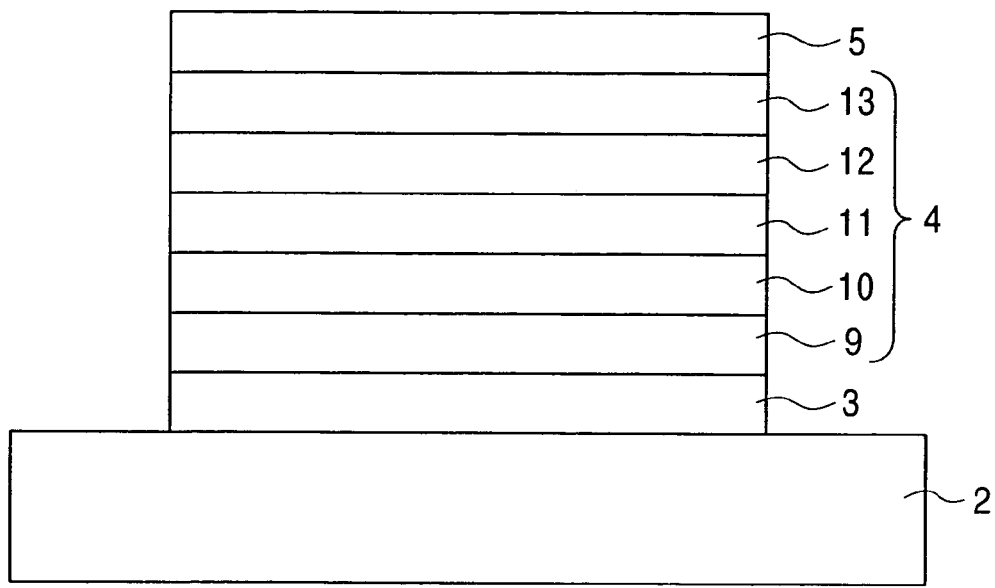
FIG. 3 is a schematic sectional view illustrating an organic EL light emitting element.

The light emission functioning layer stack 4 may include a functioning layer for providing improved emission efficiency to the light emitting layer. For example, as shown in FIG. 3, in the light emission functioning layer stack 4, a hole injection layer 9 into which holes are injected and a hole transport layer 10 for transporting holes are stacked in layers in this order on the anode electrode 3. There is deposited a light emitting layer 11 of a light emitting material on the hole transport layer 10. On the light emitting layer 11, an electron transport layer 12 for transporting electrons and an electron injection layer 13 into which electrons are injected are stacked in layers in this order. Such a structure is often employed in a low-molecular system organic EL having functioning layers each made of a low-molecular organic compound. For a high polymer organic EL having a light emission functioning layer made of a high-molecular organic compound, the light emission functioning layer stack includes a buffer layer and a light emitting layer.

As shown in FIG. 2, a plurality of (i.e., an array of) cathode electrodes 5 are provided in a stripe arrangement on the light emission functioning layer stack 4 so as to oppose and intersect the plurality of stripe anode electrodes 3 in spaced-apart relation via the light emission functioning layer stack 4. The intersecting point between the anode electrode 3 and the cathode electrode 5 serves as a light emitting region.

On the substrate 2, there are also provided conductive cathode extensions 6 each being connected to the cathode electrode. The cathode extension 6 is made of a material different from that of the cathode electrode 5. The connection end portion of the cathode extension 6 is covered with a sandwiched portion 14, which is an extended portion of at least one layer of the light emission functioning layer stack 4.

The sandwiched portion 14 may be made of the material of a layer in the light emission functioning layer stack 4, the material being capable of suitably covering a shoulder or step portion, i.e., having a so-called good step-coating property.

Figure 4:
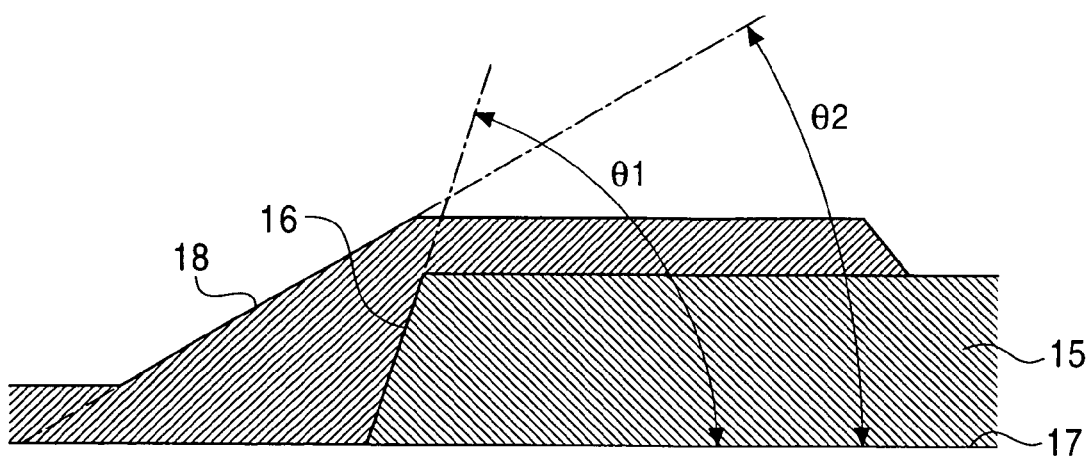
FIG. 4 is a sectional view illustrating a film having a good step-coating property.
Figure 5:
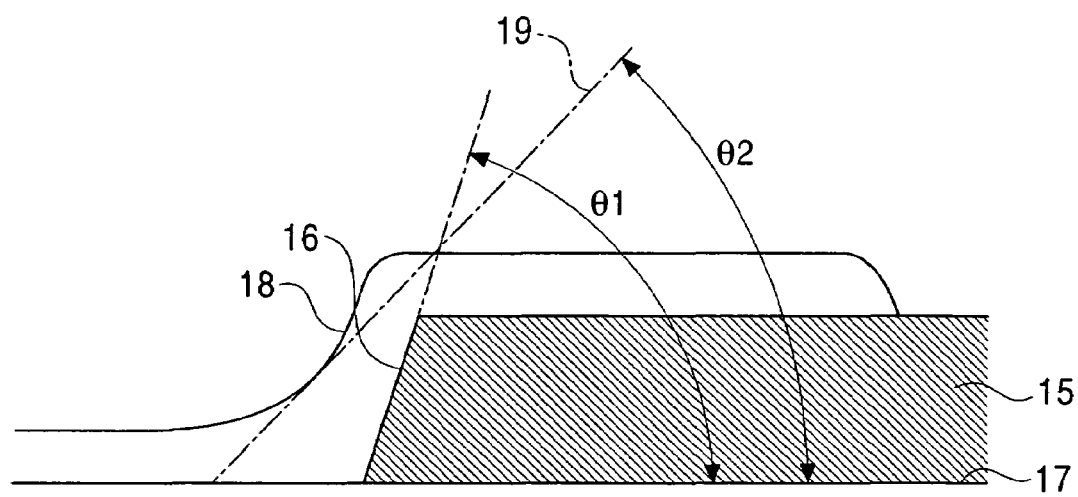
FIG. 5 is a sectional view illustrating a film having a good step-coating property.

As shown in FIG. 4, a material having a good step-coating property is one which forms a coating that satisfies the condition that $\theta_1 > \theta_2$, where $\theta_1$ is the angle between the end face 16 of a step portion 15 and a substrate 17, and $\theta_2$ is the angle between the substrate 17 and a coating slope 18 formed by the material being coated on the end face 16. As shown in FIG. 5, suppose that the coating slope 18 is curved and therefore difficult to define angle $\theta_2$. In this case, $\theta_2$ is defined as the angle between a tangent 19 to the coating slope 18 at the vicinity of the middle point thereof and the substrate 17.

The sandwiched portion 14 can be formed of only one material having a good step-coating property or a plurality of layers including a material having a good step-coating property. For example, a material having a good step-coating property may be deposited on the substrate side, and then the material of another functioning layer may be deposited thereon.

Figure 6:
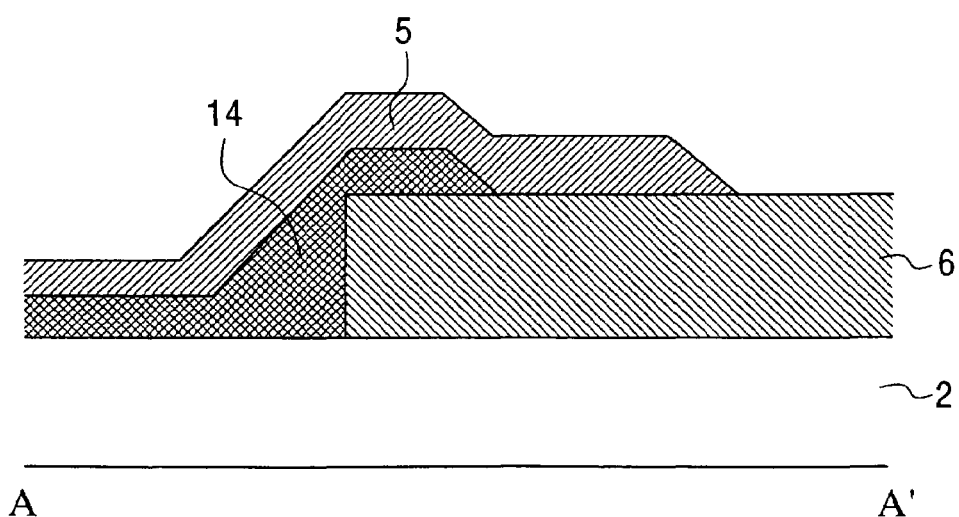
FIG. 6 is a sectional view taken along the line A-A' of FIG. 2.

The cathode electrode 5 is connected to the cathode extension 6 beyond a tip of the sandwiched portion 14. As shown in FIG. 6, the sandwiched portion 14 forming a slope allows the cathode electrode 5 to be connected to the cathode extension 6 without causing a break in the cathode electrode 5 even when the cathode extension 6 has a large thickness. Furthermore, the number of types of the materials for fabricating the light emitting display can be reduced since the sandwiched portion 14 is made of a material that constitutes the light emission functioning layer stack 4.

Figure 7:
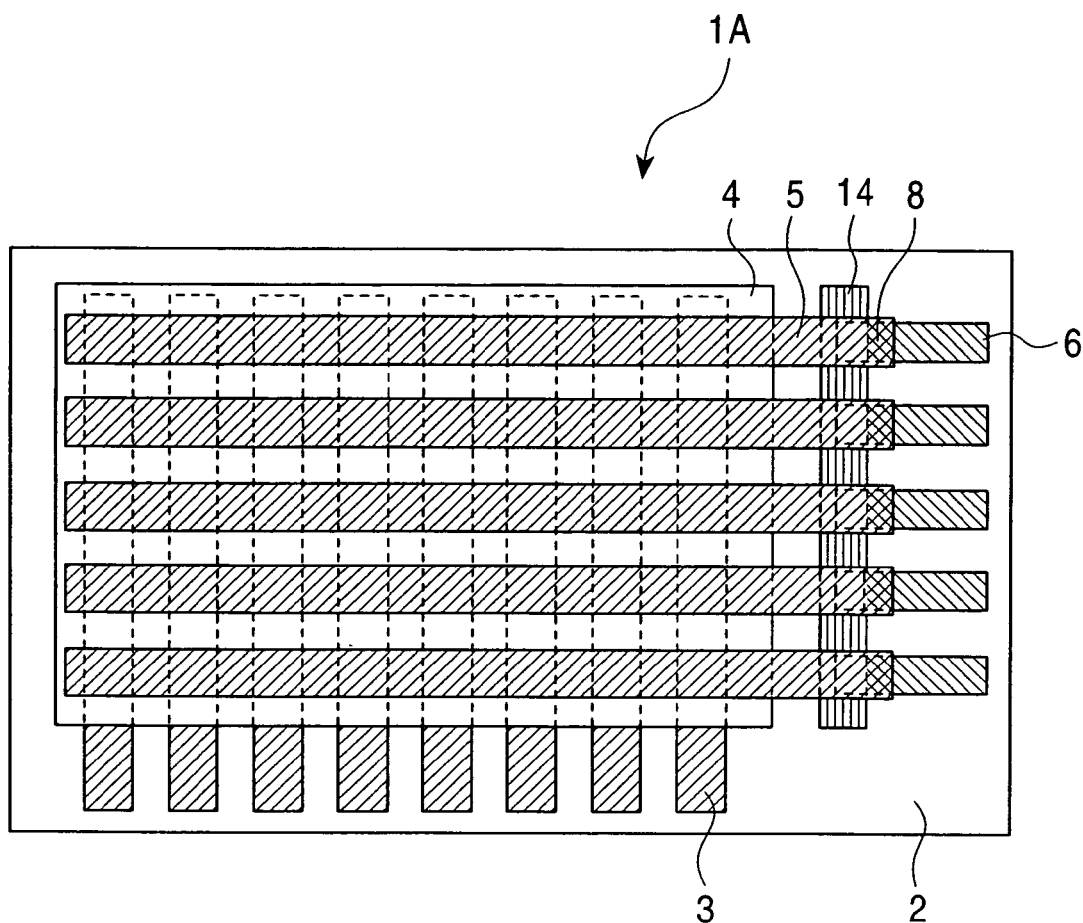
FIG. 7 is a plan view illustrating a modified example of the light emitting display panel according to the present invention.

The sandwiched portion 14 may be spaced apart from the light emission functioning layer stack 4. For example, as shown in FIG. 7, the sandwiched portion 14 may be formed in an island shape, including the material of a layer in the light emission functioning layer stack 4, the material having a good step-coating property.

Figure 8:
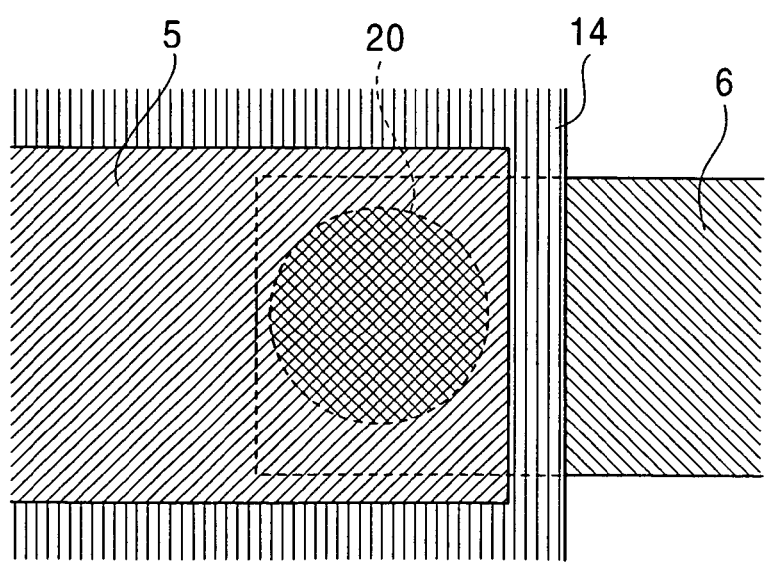
FIG. 8 is a plan view illustrating a connection area in which a cathode electrode is connected to a cathode extension.
Figure 9:
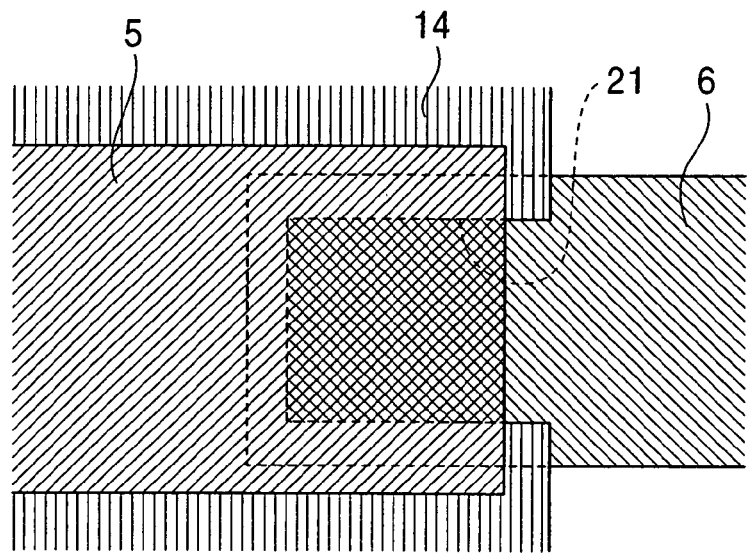
FIG. 9 is a plan view illustrating a connection area in which a cathode electrode is connected to a cathode extension.

The sandwiched portion 14 may also be provided at its end portion with a notched portion. For example, the notched portion may be a window 20 which penetrates the sandwiched portion 14 and through which the cathode electrode 5 connects to the cathode extension 6 (see FIG. 8). The notched portion may also be a rectangular cutting 21 which is provided at an end portion of the sandwiched portion 14 and at which the cathode electrode 5 connects to the cathode extension 6 (see FIG. 9). Alternatively, a separate piece of the sandwiched portion 14 may also be provided at each end portion of a plurality of cathode extensions 6.

Figure 10:
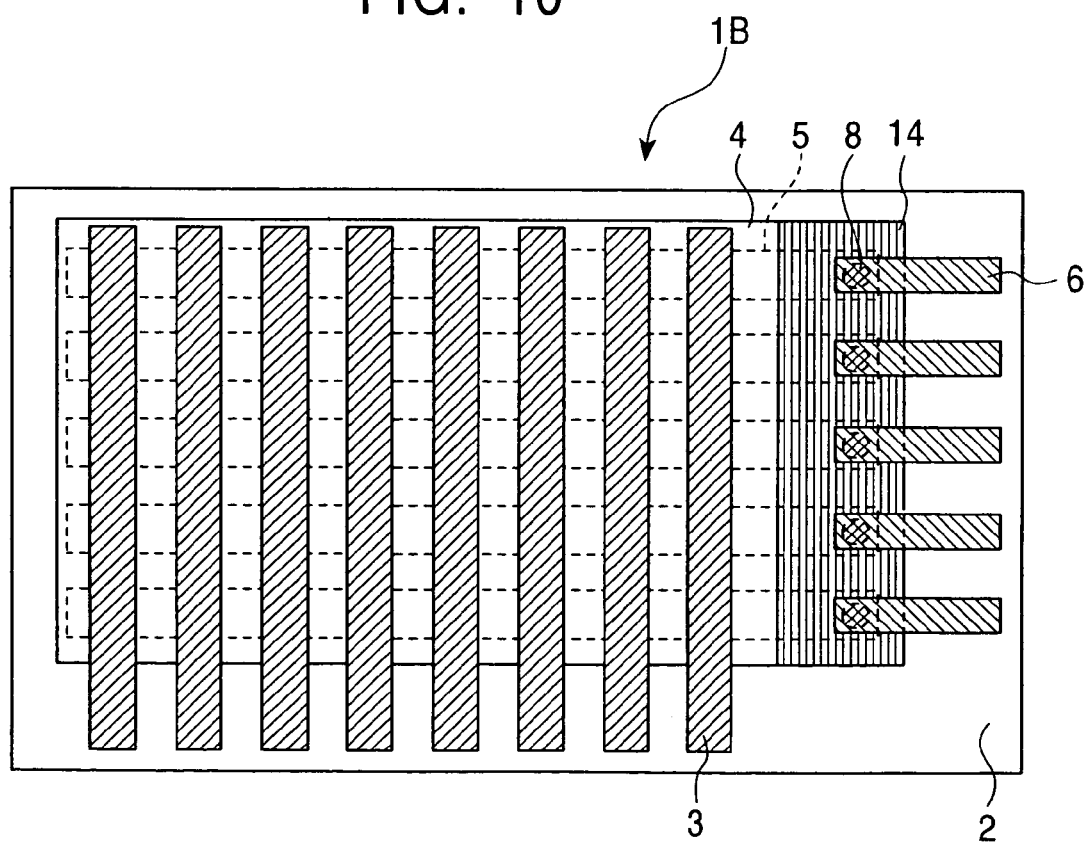
FIG. 10 is a plan view illustrating a modified example of the light emitting display panel according to the present invention.

Take an example in which the layers in the light emitting region are stacked on the substrate in the order opposite to that of the aforementioned embodiment. FIG. 10 shows the embodiment as a light emitting display 1B in which the cathode electrode, the light emission functioning layer stack, and the anode electrode are stacked in layers in this order on the substrate.

The light emitting display 1B is provided with a light emitting region that includes a plurality of cathode electrodes 5, a light emission functioning layer stack 4, and a plurality of anode electrodes 3, which are stacked in layers in this order on the substrate 2. An end portion of the cathode electrode 5 is covered with the sandwiched portion 14 made of the material of a layer in the light emission functioning layer stack, the material having at least a good step-coating property. The cathode electrode 5 is provided with the connection area 8 that is not covered with the sandwiched portion 14. The cathode extension 6 is so arranged as to connect its end portion to the connection area 8. In this arrangement, the cathode extension can be made of a material which is resistant to damage. This allows the light emitting display panel to be connected to an external circuit without any damage to the electrodes, thereby improving the efficiency of fabricating the panel.

The aforementioned embodiment describes the light emitting display having the cathode electrode provided with the cathode extension 6; however, the present invention is not limited thereto. The anode electrode may also be provided with an anode electrode extension.

Figure 11:
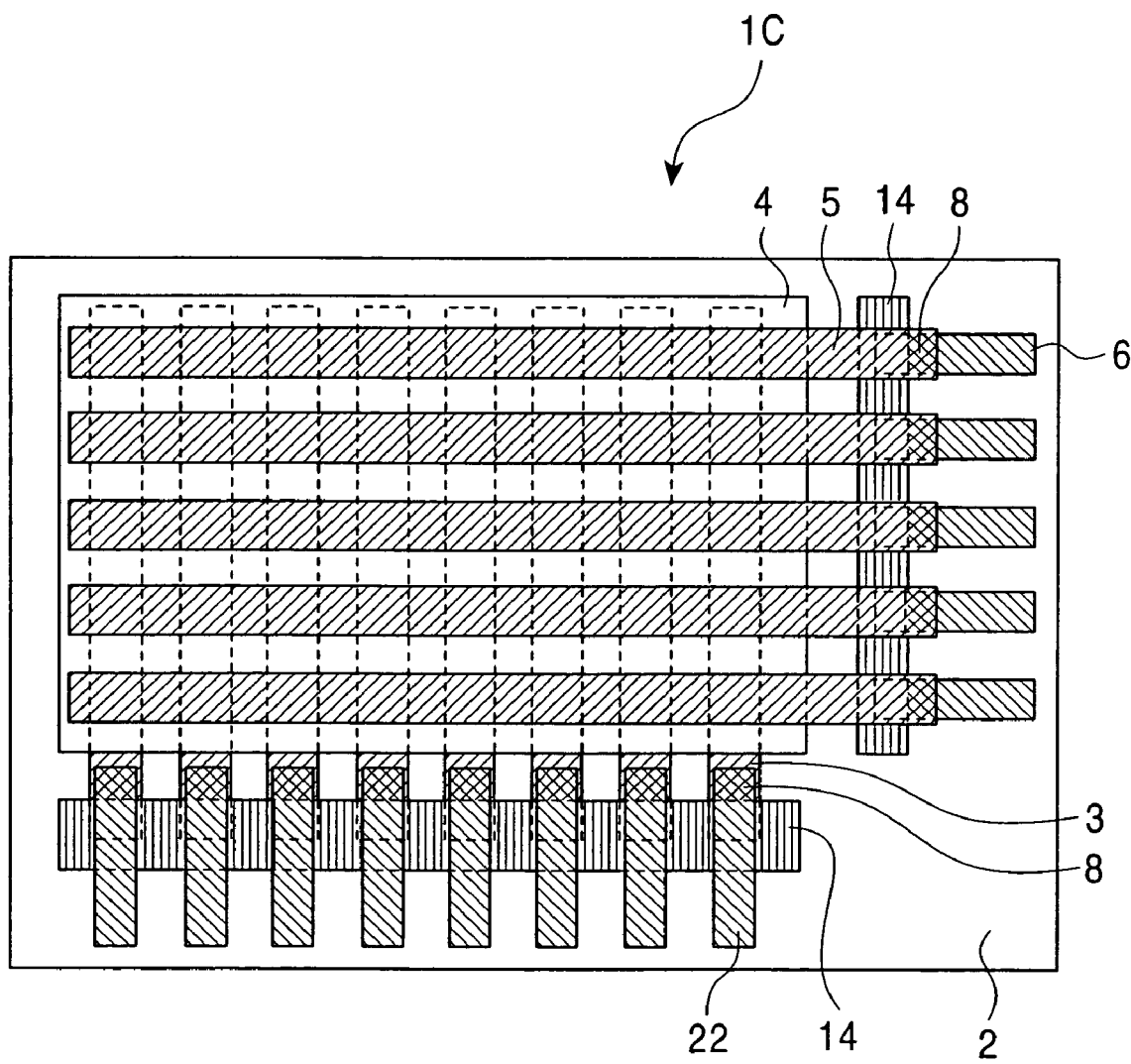
FIG. 11 is a plan view illustrating a modified example of the light emitting display panel according to the present invention.

For example, the arrangement shown in FIG. 11 may also be employed in which an end face of the connection end portion of the anode electrode 3 is covered with an island-shaped sandwiched portion 14, allowing an anode extension 22 to be connected to the anode electrode 3 beyond the tip of the sandwiched portion 14.

Figure 12:
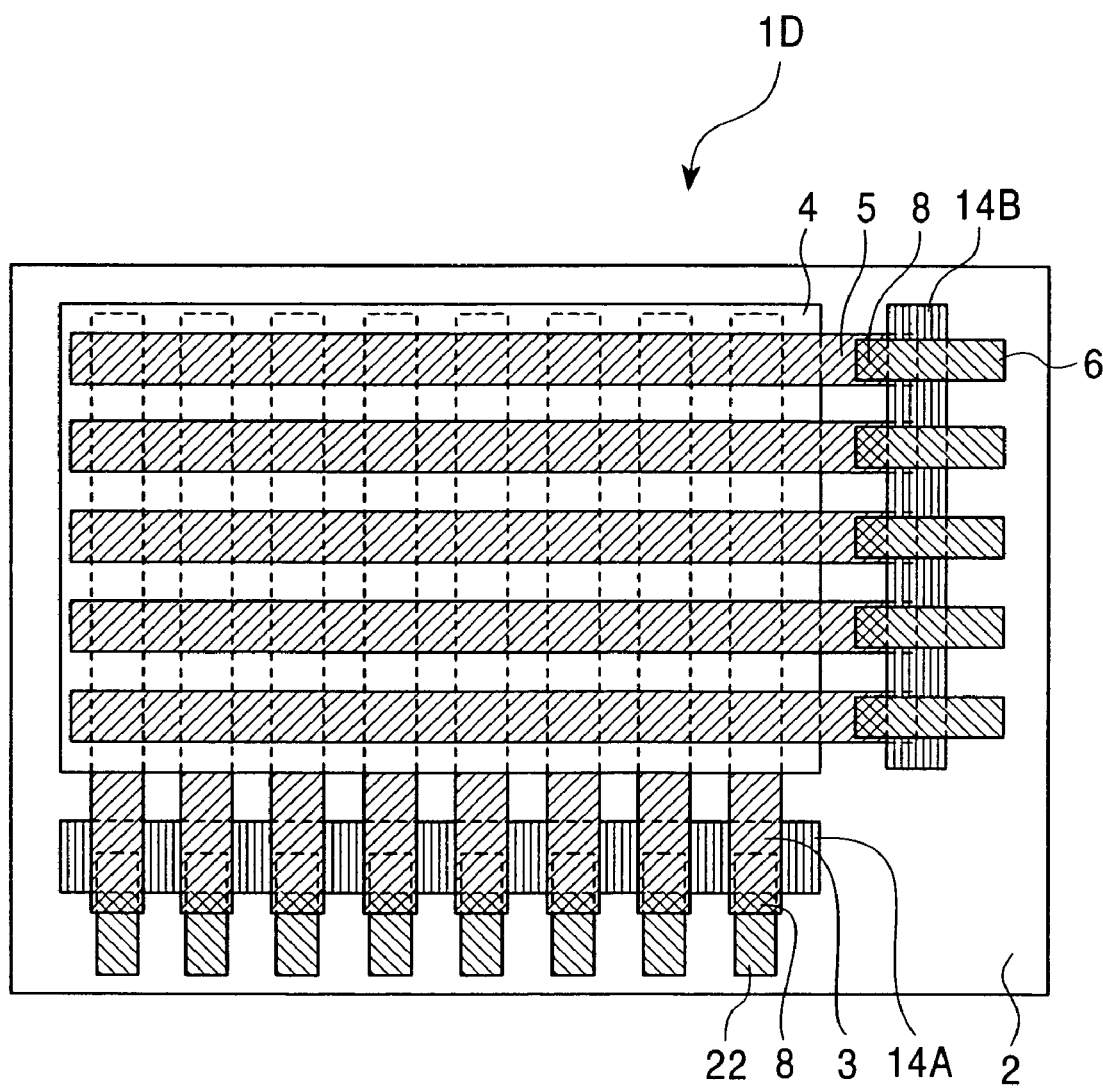
FIG. 12 is a plan view illustrating a modified example of the light emitting display panel according to the present invention.
Figure 13:
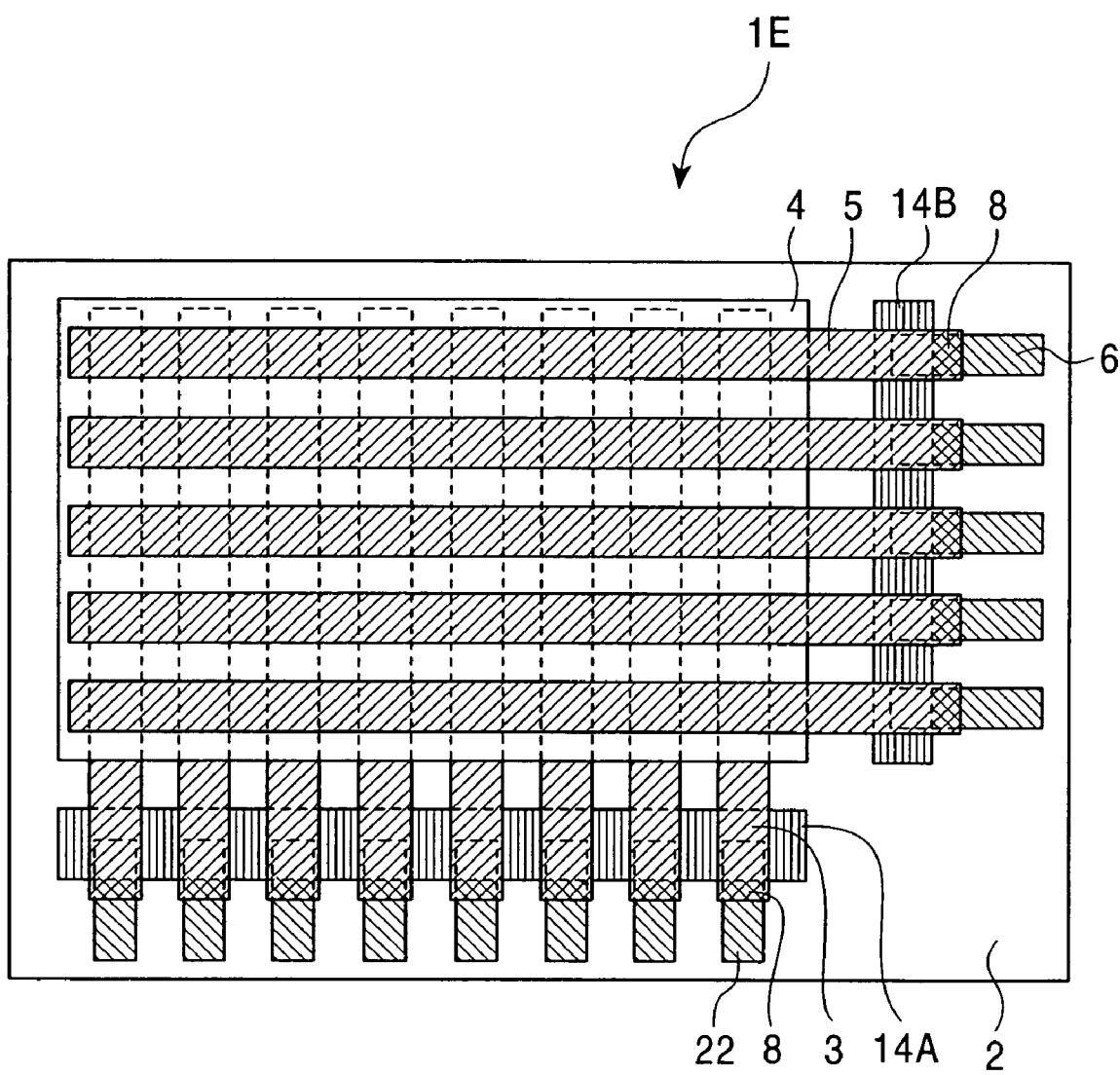
FIG. 13 is a plan view illustrating a modified example of the light emitting display panel according to the present invention.

Alternatively, the arrangements shown in FIGS. 12 and 13 may also be employed in which the end face of the connection end portion of the anode extension 22 is covered with an island-shaped sandwiched portion 14A, allowing the anode electrode 3 to be connected to the anode extension 22 beyond the tip of the sandwiched portion 14.

The portion excluding the anode and cathode electrode extensions may be sealed in an encapsulating can prevent the portion from being exposed to the air. With the anode and cathode extensions being made of a durable material, the sealing ensures a positive connection to an external circuit even when the anode and cathode electrodes are made of a material subject to corrosion.

Now, a method of fabricating the light emitting panel constructed as described above is described below.

First, the step of forming the anode electrode is performed to provide the plurality of stripe anode electrodes on a transparent substrate such as of glass. For example, the step of forming the anode electrode includes the step of depositing by sputtering an indium tin oxide (ITO) film in a thickness of 1500 angstroms on the transparent substrate. The step may also include the step of patterning by etching using a photoresist. The step of patterning includes the step of forming a photoresist, e.g., Photoresist AZ6112 supplied by TOKYO OHKA KOGYO CO., LTD., in the form of stripes on the ITO film, and the step of removing by etching the ITO uncovered with the photoresist. For example, in such an etching step, the substrate is immersed into a liquid mixture of a ferric chloride aqueous solution and a hydrochloric acid solution.

After the step of forming the anode electrode, the step of forming the cathode extension is performed to form the stripe cathode extensions. The cathode extension may be made of Mo, Ni, W, Cr, Au, Pd, or Pt, or an alloy containing these elements. The step of forming the cathode extensions may include the step of depositing a Cr film by sputtering in a thickness of 3000 angstroms. Alternatively, the step of forming the cathode extension may also include the step of immersing a striped photoresist (e.g., AZ6112) into an etchant (e.g., an aqueous solution mainly composed of cerium antimony nitrate), thereby forming a pattern of the cathode extensions.

After the step of forming the cathode extensions, the step of forming the light emission functioning layer stack is performed to deposit each functioning layer of the light emission functioning layer stack. In the step of forming the light emission functioning layer stack, the step of forming the sandwiched portion may also be performed at the same time to place the material of at least one layer of the light emission functioning layer stack at the end portion of the cathode extension to provide the sandwiched portion for covering the end portion therewith. Since the sandwiched portion and the light emission functioning layer stack can be formed at the same time, the number of fabrication steps can be reduced.

The material to be used for the sandwiched portion has preferably a good step-coating property.

The light emission functioning layer stack and the sandwiched portion are formed through a wet process or a dry process depending on the material.

The wet process employs a spin coating method, a blade coating method, or a printing method. For example, the spin coating may be used to apply a solution of a polyaniline derivative dissolved in an organic solvent and added with an acid to form a polyaniline film in a thickness of 450 angstroms by heating the substrate. The wet process allows for adjusting the component ratio between the solvent and the dissolved substance to control viscosity or the like, thereby readily forming the sandwiched portion having a good step-coating property.

On the other hand, the dry process employs a vapor deposition method or an ionization method. In the dry process, the CVD method and the sputtering method provides isotropic adhesion of evaporated molecules to thereby form a sandwiched portion having a good step-coating property. On the contrary, the vapor deposition method causes evaporated molecules to flow anisotropically. Therefore, it is difficult to form a sandwiched portion having a good step-coating property. However, even the vapor deposition method can also be used to form a sandwiched portion having a good step-coating property, for example, by spinning, rotating, or shaking the substrate with respect to the flow of the evaporated molecules.

Figure 14A:
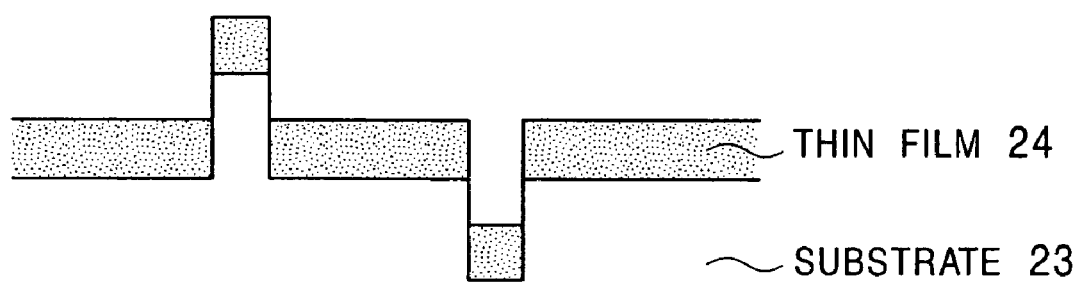
FIGS. 14A and 14B are sectional views each illustrating a step of a method of fabricating a film having a good step-coating property according to the present invention.
Figure 14B:
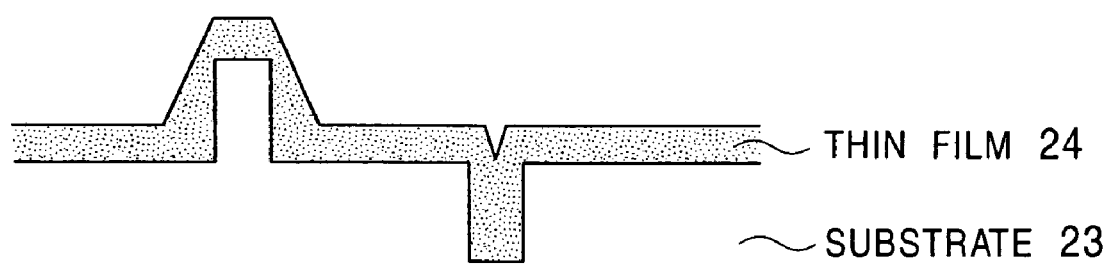

Alternatively, as shown in FIGS. 14A and 14B, after a thin film 24 is deposited on a substrate 23 (FIG. 14A), the substrate 23 is heated up to around the glass transition temperature or the melting point of the material of the thin film, thereby forming a layer having a good step-coating property (FIG. 14B).

The sandwiched portion may include a functioning layer made of a material other than one having a good step-coating property. Accordingly, the step of forming the sandwiched portion may also be performed even when a material forming other light emission functioning layers is deposited. Since this arrangement allows for employing a common pattern for the thin films to be deposited, the number of masks used can be reduced.

The step of forming the sandwiched portion and the step of forming the light emission functioning layer stack may not be performed at the same time. For example, the step of forming the sandwiched portion may be performed before or after the step of forming the light emission functioning layer stack.

After the light emission functioning layer stack and the sandwiched portion have been formed, the step of forming the cathode electrode is performed to provide a plurality of cathode electrodes. In this step, for example, the cathode electrode is disposed in orthogonal relation to the anode electrode via the light emission functioning layer stack and connected to the connection area of the cathode extension. The materials of the cathode electrode include, for example, Al—Li alloy, which is deposited using a mask by vapor deposition in a thickness of 1000 angstroms.

Through the aforementioned steps, the light emitting display panel is formed as shown in FIG. 2.

As a modified example, the step of forming the sandwiched portion may include the step of providing the material of at least one layer of the light emission functioning layer stack at the end portions of the cathode extension and the anode electrode. Also included is the step of forming the anode extension, after the step of forming the sandwiched portion, for connection to the anode electrode at its end portion beyond the tip of the sandwiched portion. The aforementioned steps included allow for forming the light emitting display panel that is provided with the anode extension as shown in FIG. 11.

Now, a method of fabricating the light emitting display panel as shown in FIG. 10 will be described below.

The step of forming the cathode electrode is performed to provide a plurality of stripe cathode electrodes 5 on the substrate 2. After the step of forming the cathode electrode, the step of forming the light emission functioning layer stack is performed to stack each of the functioning layers of the light emission functioning layer stack 4. To deposit a layer of a material having a good step-coating property in the step of forming the light emission functioning layer stack, the step of forming the sandwiched portion may also be performed at the same time to provide the material at the end portion of the cathode electrode 5, thereby providing the sandwiched portion 14 for covering the end portion. The step of forming the sandwiched portion includes the step of forming the connection area 8 that is not covered with the sandwiched portion at the cathode electrode.

After the light emission functioning layer stack 4 and the sandwiched portion 14 have been formed, the step of forming the cathode extension is performed to form the cathode extensions 6 for connecting to the connection area 8.

After the cathode extension 6 is formed, the step of forming the anode electrode is performed to form the anode electrodes 3, thereby providing the light emitting display panel.

A method of fabricating the light emitting display panel 1D as shown in FIG. 12 includes the steps of forming the anode extension to provide the anode extension 22 on the substrate 2 and then forming a first sandwiched portion to provide the island-shaped sandwiched portion 14A at the end portion of the anode extension 22. After the step of forming the first sandwiched portion, the anode electrode 3 is formed to be connected to the anode extension 22 beyond the tip of the sandwiched portion 14A.

After the step of forming the anode electrode, the steps of forming the light emission functioning layer stack and forming the cathode extension are sequentially performed to form the light emission functioning layer stack 4 on the anode electrode 3 and the cathode electrode 5 on the light emission functioning layer stack 4. The light emission functioning layer stack 4 includes a layer of the same material as the one of the sandwiched portion 14.

The step of forming a second sandwiched portion is performed to provide an island-shaped sandwiched portion 14B at the connection end portion of the cathode electrode 5. In the step of forming the second sandwiched portion, the sandwiched portion 14B is provided using the material of at least one layer of the light emission functioning layer stack. Alternatively, the sandwiched portion 14B may also be formed of the same material as that of the sandwiched portion 14A.

After the step of forming the second sandwiched portion, the cathode extension 6 is formed to be connected to the cathode electrode 5 beyond the tip of the sandwiched portion 14B. Through the aforementioned steps, the light emitting display panel 1D can be obtained.

As described above, the steps of forming the first and second sandwiched portions cannot be performed at the same time as the step of forming the light emission functioning layer stack. However, since the sandwiched portions can be made of a material of the light emission functioning layer stack, the number of types of materials can be reduced.

Now, as a modified example, a method of fabricating a light emitting display panel 1E as shown in FIG. 13 will be described below.

The steps of forming the cathode and anode extensions are performed to form an array of rectangular cathode extensions 6 on the substrate 2 and an array of rectangular anode extensions 22 extending in orthogonal relation to the length of the cathode extension, respectively. Alternatively, the steps of forming the cathode and anode extensions can be performed at the same time.

The island-shaped sandwiched portion 14A is provided at the connection end portion of the anode extension 22. After the step of forming the first sandwiched portion, the step of forming the anode electrode is performed to form the anode electrode 3 for connection to the anode extension 22 beyond the sandwiched portion 14A.

After the step of forming the anode electrode, the steps of forming the light emission functioning layer stack and the second sandwiched portion are performed to provide the light emission functioning layer stack 4 including the light emitting layer on the anode electrode 3 and the sandwiched portion 14B for covering the cathode extension 6, respectively. Alternatively, the step of forming the light emission functioning layer stack may also be performed at the same time as the step of forming the second sandwiched portion.

After the light emission functioning layer stack 4 and the sandwiched portion 14B have been formed, the cathode electrode 5 is disposed in orthogonal relation to the anode electrode via the light emission functioning layer stack to be connected to the connection area of the cathode extension. Through the step of forming the cathode electrode, the light emitting display panel 1E is obtained.

In the aforementioned examples, for convenience in description, the electrodes have been referred to separately as the "anode electrode" and "cathode electrode". However, the present invention is also applicable to display panels having inorganic EL elements that are operated with alternating current without identifying the electrodes as having the positive or negative polarities.

Additionally, the aforementioned embodiments have been described with reference to the passive addressing light emitting display panel. However, the present invention is also applicable to the active addressing light emitting display panel. For example, either the first electrodes or the second electrodes may be formed of one electrode.

Alternatively, the first and the second electrodes may be each formed of one electrode. For example, such an arrangement can be used for a backlight that is employed in the liquid crystal display device.

According to an aspect of the present invention, provided is a light emitting display panel which has at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected. This light emitting display panel is characterized by including a sandwiched portion sandwiched between the electrode extension and the connection end portion, in which the sandwiched portion includes at least one layer of the light emission functioning layer stack. This feature allows for connection to an external circuit without any damage to the electrodes by forming the electrode extension of an unbreakable material, thereby fabricating the light emitting display with stability.

According to another aspect of the present invention, provided is a method of fabricating a light emitting display panel which has at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected. The method is characterized by including the steps of forming the electrode extension; forming a sandwiched portion including at least one layer of the light emission functioning layer stack at the electrode extension; and connecting the connection end portion to the electrode extension. This feature allows the shared use of the material of the sandwiched portion and one material of the light emission functioning layer stack, thereby enabling the light emitting display panel to be fabricated at reduced cost.

According to a further aspect of the present invention, provided is a method for fabricating a light emitting display panel which has at least one first electrode, at least one second electrode opposing and intersecting the first electrode, a light emission functioning layer stack sandwiched between the first and second electrodes and including a light emitting layer emitting light when powered, and a conductive electrode extension to which a connection end portion of at least one of the first and second electrodes is electrically connected. The method is characterized by including the steps of forming the first electrode; forming a sandwiched portion including at least one layer of the light emission functioning layer stack at the first electrode; and connecting the electrode extension to the connection end portion. This feature allows the sandwiched portion and the light emission functioning layer stack to be formed at the same time, thereby reducing the number of fabrication steps.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2003-103802 which is hereby incorporated by reference.

What is claimed is:

1. A light emitting display panel including at least one first electrode, at least one second electrode opposing and intersecting said first electrode, a light emission functioning layer stack sandwiched between said first and second electrodes and including a light emitting layer emitting light when powered, and a conductive electrode extension to which a connection end portion of at least one of said first and second electrodes is electrically connected, said light emitting panel comprising:

a sandwiched portion sandwiched between said electrode extension and said connection end portion, wherein said sandwiched portion includes at least one layer of said light emission functioning layer stack.

2. The light emitting display panel according to claim 1, wherein said sandwiched portion has a good step-coating property.

3. The light emitting display panel according to claim 1, wherein said sandwiched portion covers an end face of said electrode extension, and said connection end portion is connected to a surface of said electrode extension beyond a tip of said sandwiched portion.

4. The light emitting display panel according to claim 1, wherein said sandwiched portion covers an end face of a connection end portion of at least one of said first and second electrodes, and said electrode extension is connected to a surface of said electrode beyond a tip of said sandwiched portion.

5. The light emitting display panel according to claim 1, wherein said sandwiched portion is formed of an extended portion of said at least one layer.

6. The light emitting display panel according to claim 1, wherein said sandwiched portion has a notched portion, and said connection end portion and said electrode extension are connected to each other at said notched portion.

7. The light emitting display panel according to claim 1, wherein said first electrode is an array of electrodes disposed in parallel to each other.

8. The light emitting display panel according to claim 1, wherein said second electrode is an array of electrodes disposed in parallel to each other.

* * * * *